United States Patent [19]

Kameda et al.

[11] Patent Number: 4,881,069
[45] Date of Patent: Nov. 14, 1989

[54] FONT COMPRESSION METHOD AND APPARATUS

[75] Inventors: Kazuyoshi Kameda; Koichi Kaji, both of Yokohama; Hiroshi Yahiro, Yokosuka; Kenichiro Kobayashi, Tokyo, all of Japan

[73] Assignee: Kabushiki Kaisha Toshiba, Kawasaki, Japan

[21] Appl. No.: 134,552

[22] Filed: Dec. 15, 1987

Related U.S. Application Data

[63] Continuation of Ser. No. 760,513, Jul. 30, 1985, abandoned.

[30] Foreign Application Priority Data

Nov. 15, 1984 [JP] Japan ................ 59-240982

[51] Int. Cl.⁴ .............................. G09G 1/16
[52] U.S. Cl. ...................... 340/735; 340/731; 340/748; 382/47
[58] Field of Search ............. 340/731, 735, 748, 790, 340/750, 799; 382/47, 56

[56] References Cited

U.S. PATENT DOCUMENTS

| | | | |
|---|---|---|---|
| 4,090,188 | 5/1978 | Suga | 340/731 |
| 4,181,973 | 1/1980 | Tseng | 340/73 X |
| 4,254,416 | 3/1981 | Lelke | 340/731 X |
| 4,286,329 | 8/1981 | Goertzel et al. | 340/731 X |
| 4,409,591 | 10/1983 | Simkovitz | 340/731 |
| 4,447,882 | 5/1984 | Walz | 340/731 X |
| 4,555,191 | 11/1985 | Gojo | 340/731 X |
| 4,598,283 | 7/1986 | Tung et al. | 340/731 |

FOREIGN PATENT DOCUMENTS 13806176 11/1980 Japan .

Primary Examiner—David K. Moore
Assistant Examiner—M. Fatahiyar
Attorney, Agent, or Firm—Foley & Lardner, Schwartz, Jeffery, Schwaab, Mack, Blumenthal & Evans

[57] ABSTRACT

The font compression method according to the present invention comprises the steps of (a) dividing a first type font matrix to be compressed into a plurality of sections consisting of an equal number of bits in the direction of the columns and/or rows of the matrix; (b) comparing information bits in the bit positions in each divided section and in the first bit position in the adjacent next section in accordance with a predetermined rule; (c) determining information bits to be dropped in accordance with the result of the comparison, extracting the remaining information bits in each section other than the dropped information bits successively, and classifying the information bits thus extracted into predetermined bit patterns; and (d) repeating the operation of the steps (b) and (c) until the processing of the last column and /or the last row terminates. By the font compression method according to the present invention, a font of characters and figures arranged in a 24×24 matrix for instance, can be compressed into another font, arranged in a 16×16 dot matrix, for instance, but maintaining the features of the original characters and figures. A font compression apparatus for automatically compressing a font of characters and figures through a microprocessor is also disclosed.

11 Claims, 5 Drawing Sheets

24X24 DOTS

16X16 DOTS

DUMMY DOT ROW

FIG. 4

| CLASSIFICATION NUMBER | 24 DOTS | | | | 16 DOTS | |
|---|---|---|---|---|---|---|
| | A | B | C | D | E | F |
| I | 0 | 0 | 0 | 0 | A0 | B0 |
| II | 0 | 0 | 0 | 1 | B0 | C0 |
| II | 0 | 0 | 1 | 0 | B0 | C1 |
| I | 0 | 0 | 1 | 1 | A0 | B0 |
| I | 0 | 1 | 0 | 0 | A0 | B1 |
| IV | 0 | 1 | 0 | 1 | A0 | B1 |
| III | 0 | 1 | 1 | 0 | A0 | C1 |
| I | 0 | 1 | 1 | 1 | A0 | B1 |
| I | 1 | 0 | 0 | 0 | A1 | B0 |
| III | 1 | 0 | 0 | 1 | A1 | C0 |
| IV | 1 | 0 | 1 | 0 | A1 | C1 |
| I | 1 | 0 | 1 | 1 | A1 | B0 |
| I | 1 | 1 | 0 | 0 | A1 | B1 |
| II | 1 | 1 | 0 | 1 | B1 | C0 |
| II | 1 | 1 | 1 | 0 | B1 | C1 |
| I | 1 | 1 | 1 | 1 | A1 | B1 |

(24 x 32 DOTS)

(32 x 24 DOTS)

(16 x 22 DOTS)

(22 x 16 DOTS)

FONT COMPRESSION METHOD AND APPARATUS

This application is a continuation of application Ser. No. 760,513, filed July 30, 1985 now abandoned.

BACKGROUND OF THE INVENTION

1. Field of the Invention

The present invention relates to a font compression method and apparatus which are capable of advantageously compressing a font of characters and figures or patterns expressed by dots, without deterioration of the original characters and patterns.

2. Description of the Prior Art

It is a normal practice to form a font of characters by data in a 24×24 dot matrix, when displaying and printing, for instance, characters by means of a personal computer and a word processor. However, the print of many of these output units including dot printers normally consists of a 16×16 dot matrix. Accordingly, when using these output units, it is necessary to compress a 24×24 dot matrix font into a 16×16 dot matrix font. In this case, the method of compression according to the prior art was to uniformly extract dots in such a manner that one dot for every two dots is dropped or deleted from the 24×24 dot matrix when converting it into a 16×16 dot matrix. This compression method according to the prior art has a major disadvantage. That is, relatively wide spaced portions which separate lines of characters and figures and portions between the lines are expressed by a plurality of dots of the same kind arranged successively. These lines and spaced portions do not affect the features of characters and patterns, even if the length of the lines is shortened or the size of the spaced portions is made small by dropping or deleting some dots. On the other hand, with respect to a spot of a character or figure, or a relatively narrow spaced portion expressed by a single dot, the form of the character and the figure is deformed if the single dot is dropped or the spaced portion is lost. Accordingly, when a font is to be compressed, it is preferable to compress from lines and relatively wide spaced portions of characters and figures. This is not done in the prior art.

Moreover, when a font of the characters and patterns is compressed such that it is unbalanced, e.g. when it is compressed mostly, for instance, in the right portion of the characters with the left portion being seldom compressed or almost without compression, the form of the characters is also deformed. Accordingly, it is necessary to compress the font in a uniform or balanced condition by dropping the most suitable dots from each portion of the font.

In the font compression method according to the prior art, however, as information bits to be dropped are not necessarily suitable, the font after compression is deformed in such a way that vertical and horizontal lines of the characters and figures are often split or the lines of characters and figures often merge with each other, thus making read-out of these characters extremely difficult.

SUMMARY OF THE INVENTION

It is therefore an object of the present invention to provide an improved font compression method in which the features of patterns of an original font are effectively maintained in the font after compression and reading of the font after compression to easy.

It is another object of the present invention to provide a font compression method for compressing a first type font of characters and figures arranged in an XY dot matrix into a second type font of the characters and figures, arranged in a NM matrix by dropping predetermined dots in the direction of columns and/or rows of the XY dot matrix in accordance with a predetermined rule.

It is another object of the present invention to provide a font compression method which comprises the steps of dividing the columns and/or rows of a first type font into a plurality of equal sections, dropping only a specified information bit among information bits in bit positions included in each section in accordance with a predetermined rule, extracting the remaining information bits in the specified bit positions, and repeating the above operation over the entire column and/or row, so as to form a second type font from the information bits thus extracted.

It is still another object of the present invention to provide a font compression apparatus in which a first type font stored in a font memory from a keyboard is automatically compressed into a second type font, by use of a central processing unit (CPU), control memory, a random access memory, and by having stored in the control memory a control program corresponding to the font compression method according to the present invention, according to which the characteristics or features and forms of the original characters are well maintained.

One of the features of the present invention resides in a font compression method for compressing a first type font of characters and figures arranged in an XY dot matrix into a second type font of the same arranged in a NM dot matrix by dropping predetermined dots in the direction of columns and/or rows of the XY dot matrix wherein the method comprises the steps of (a) dividing the XY dot matrix into a plurality of sections consisting of a predetermined number of bit positions along the columns and/or rows of the first type font, (b) comparing bit by bit each information bit existing in each bit position in one section and a first bit position in an adjacent next section to each other, in accordance with a predetermined rule, (c) dropping information bits in specified bit positions in the section in question in accordance with the result of the comparison and classifying predetermined bit patterns by extracting the remaining information bits in the section successively, and (d) repeating the operation of the steps (b) and (c) from the divided first section thereof, thereby obtaining the compressed font of the second type arranged in the NM matrix from information bits thus extracted.

Another feature of the present invention resides in a font compression apparatus for compressing a first type font of characters and figures arranged in an XY dot matrix into a second type font of the characters and figures, arranged in an NM dot matrix by dropping predetermined dots in the direction of columns and/or rows of the XY dot matrix wherein the apparatus comprises a keyboard, a font memory for storing the first type font inputted from the keyboard, a central processing unit for processing information associated with the first type font stored in the font memory, a random access memory for temporarily storing bit information processed by the central processing unit, and a control memory for storing predetermined control programs so as to compress the first type font into the second type font, whereby the first type front which has been inputted from the keyboard and stored into the font memory is processed by the CPU and is automatically converted into the second type font which is required by a printer.

These and other objects, features, and advantages of the present invention will be better understood from the following detailed description of the embodiment of the invention with reference to the accompanying drawings.

BRIEF DESCRIPTION OF THE DRAWINGS

FIG. 4 is a truth table for use in the font compression method according to the present invention.

DESCRIPTION OF THE PREFERRED EMBODIMENT

Figure 1:
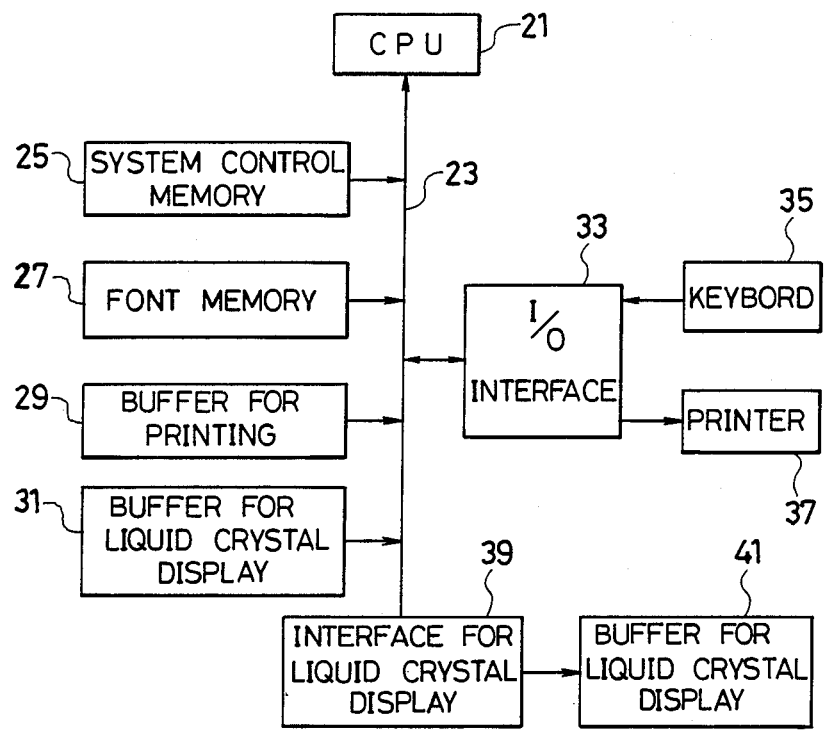
FIG. 1 is a block diagram of a font compression apparatus for realizing a font compression method according to the present invention.

Referring to FIG. 1, a block diagram of the font compression apparatus for realizing the font compression method according to the present invention is shown.

In the embodiment in FIG. 1, the font compression apparatus which is suitable for imparting an external letter preparation function to a word processor, comprises a central processing unit (CPU) 21 such as microprocessor, a system control memory 25 such as ROM (read only memory), a font memory 27, a buffer 29 for printing, a buffer 31 for a liquid crystal display, an interface 39 for a liquid crystal display, an input/output (I/O) interface 33, a keyboard 35, and a printer 37 such as dot printer. These constructing elements are communicated to each other through a bus 23.

Namely, in FIG. 1, the CPU is connected through the bus 23 to the system control memory 25, e.g. a ROM which stores various control programs, the font memory 27 for storing at least two kinds of fonts such as a 24×24 dot matrix and a 16×16 dot matrix for the external letters arbitrarily prepared by an operator, the buffer 29 for printing, and the buffer 31 for the liquid crystal display 41. Similarly, to the bus 23 there are connected through the I/O interface 33, the keyboard 35 for a word processor by which the operator of the system inputs external letters in the 24×24 dot font and the printer 37 for the word processor so as to print letters in the 24×24 dot font. The bus 23 is also connected through the interface 39 to the liquid crystal display. A liquid crystal display unit 41 for the word processor for displaying letters and figures in the 16×16 dot font is connected to the bus.

Figure 2A:
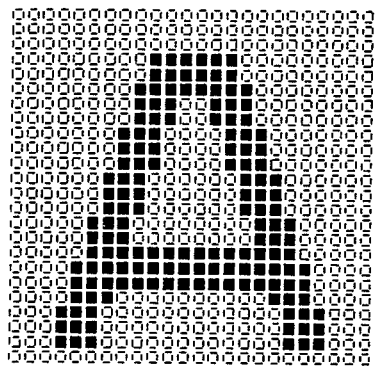
FIG. 2(A) shows the letter "A" before compression.
Figure 2B:
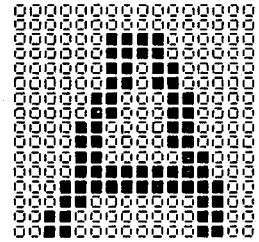
FIG. 2(B) shows the letter "A" compressed according to the font compression method of the present invention.

With this construction, when the operator inputs an external letter, say, "A", in the 24×24 dot font as shown in FIG. 2(A) from the keyboard 35, the font is stored in the font memory 27 and after compression by the CPU 21, which will be explained later, the external letters thus stored in the font memory are also stored in the font memory 27 in a 16×16 dot matrix as shown in FIG. 2(B). As a result, the printer 37 can print the compressed 16×16 dot font representing the original 24×24 dot matrix inputted by the operator, or the compressed 16×16 dot font thus converted or compressed can also be displayed on the liquid crystal display unit 41.

Figure 3A:
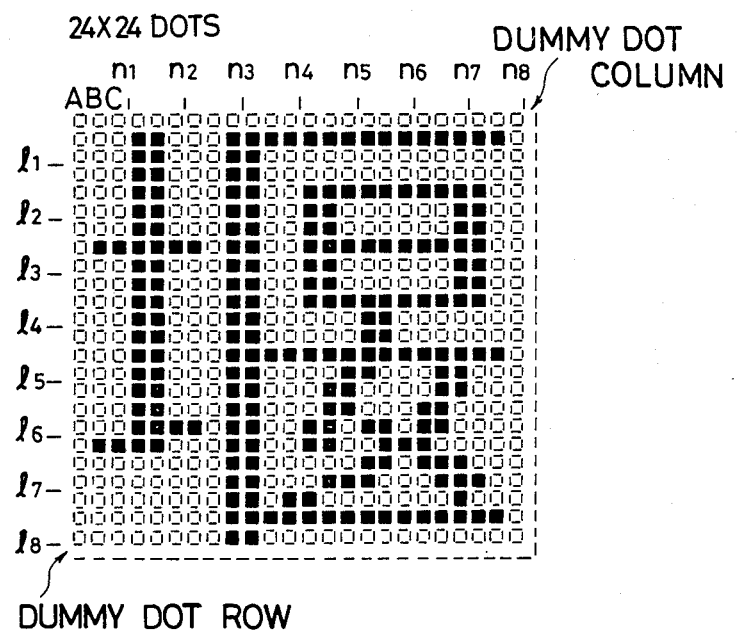
FIG. 3(A) shows a Chinese character used for explaining the font compression method according to the present invention.
Figure 3B:
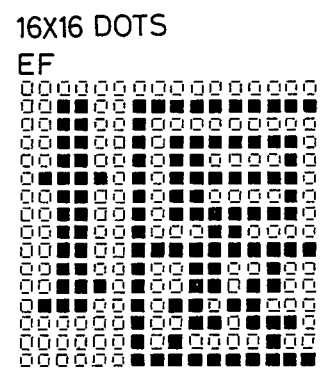
FIG. 3(B) shows the Chinese character of FIG. 3(A) compressed by the method according to the present invention.

Now, the font compression process by the use of the CPU 21, according to the present invention will be described by way of an example where a Chinese character 24×24 dot font as shown in FIG. 3(A) is converted into a 16×16 dot font as shown in FIG. 3(B). In this case, the truth table defining a rule to be used in the font compression method according to the present invention is shown in FIG. 4, and a program flow chart for compressing the character shown in FIG. 3(A) into the one shown in FIG. 3(B) by the application of the table in FIG. 4 is shown in FIG. 5.

Figure 5:
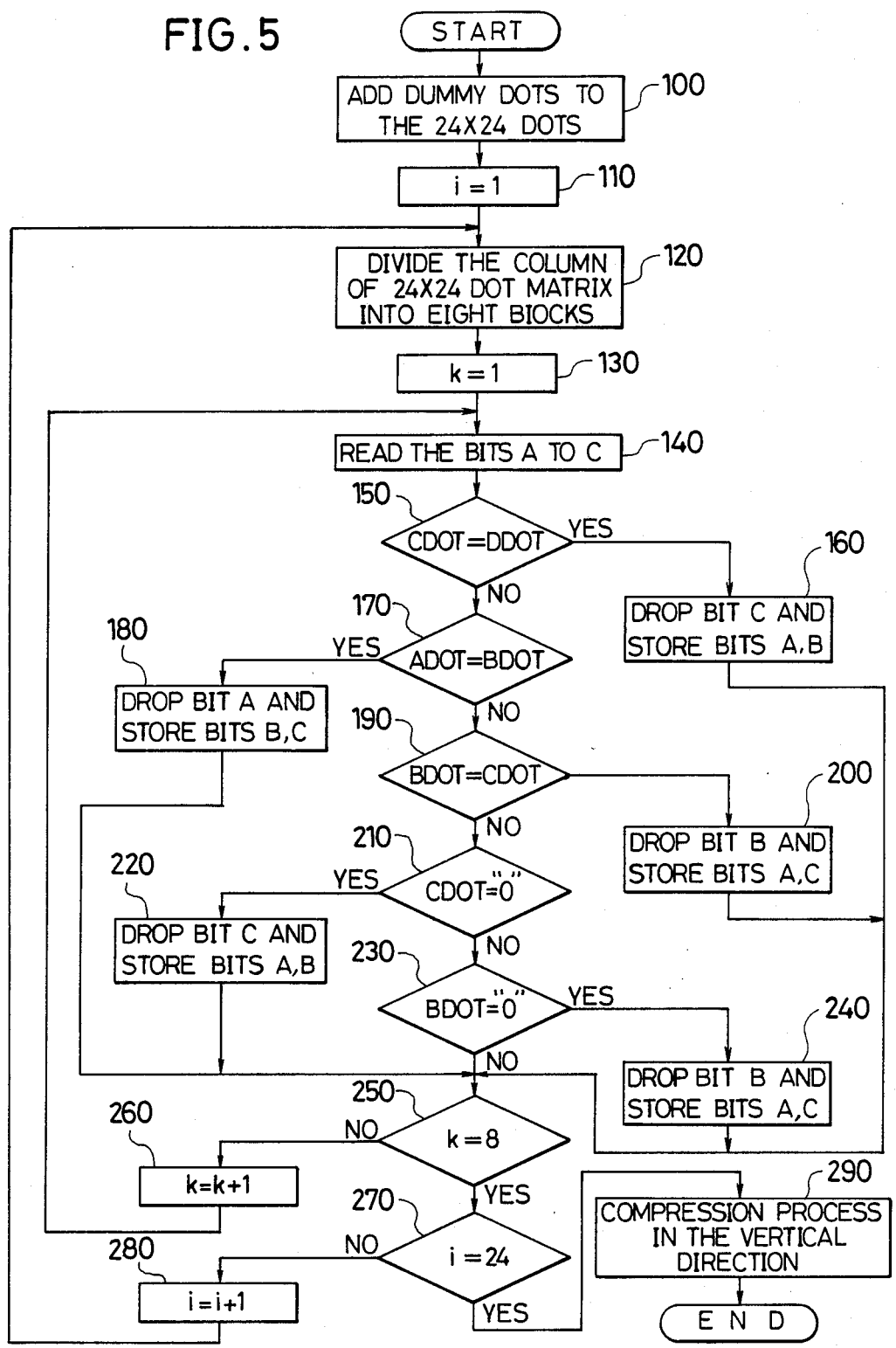
FIG. 5 is a control program flow chart of the font compression method for use in the font compression apparatus, according to the present invention.
Figure 6A:
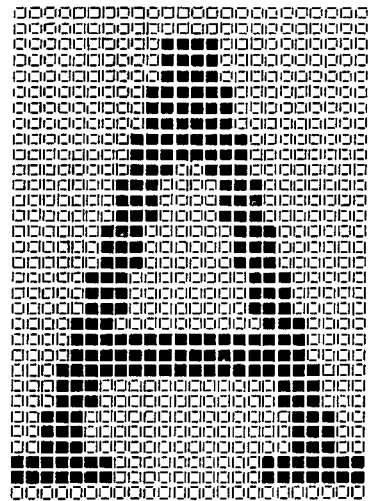
FIGS. 6(A) and 6(B) show a 32×24 dot matrix font before compression and 22×16 dot matrix font after compression by the font compression method of the present invention.
Figure 6B:
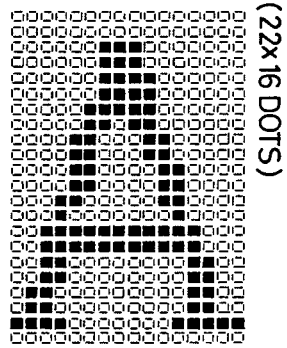

In FIG. 3(A), a dummy dot column and/or a dummy dot row of binary digits "0" is added to the last column and/or last row of the 24×24 dot font inputted by an operator, i.e. the dummy dot column and/or the dummy dot row is virtualized (see, the step 100 in FIG. 5). This step is done in order to process the dots existing in the last column and/or last row.

The compression of a font is carried out in the lateral direction. Namely, the columns of the 24×24 dot matrtix are divided into eight blocks or sections, $n_1$, $n_2$, $n_3$... $n_8$, each consisting of three dot positions A, B, C from the left to the right (the steps 110 and 120 in FIG. 5).

After this operation, if one dot for every section is dropped or deleted, the first row is compressed into 16 dots from the original matrix of 24 dots. The first dot position in the next adjacent section, say, section $n_2$ is labelled as a dot position D, which is the same as the dot position A in the section $n_2$. The remaining two dots in each section after dropping an arbitrary dot in each section are labelled as E and F dots from the left.

FIG. 4 shows a truth table of bit possibilities taken for the compression of the characters and figures. In the embodiment according to the present invention, a specific one bit among the three bits in the bit positions A, B, C of the 24×24 dot matrix is dropped or deleted from the four information bits existing in the bit positions A, B, C, D (=A in the next section) of the matrix in accordance with the rule of FIG. 4 which will be explained later, and the remaining information bits are extracted and placed into the bit positions E and F of the column or row of the 16×16 dot matrix. In this case, the bit patterns, which will be selected by the information bits in the bit positions A to D will become the sixteen combinations of bits as shown in FIG. 4 (white portion or spaced portion corresponds to bit "0", while black or existence of bit information in the matrix corresponds to bit "1").

In the steps 130 and 140 in FIG. 5, the information bits in the bit positions A to C in the first section $n_1$ and the bit position D in the next section $n_2$ are read from the font memory 27. The information bits in the bit positions C and D are compared in the CPU 21 and when the comparison is established, i.e. the information bits in the bit positions C and D are the same, the information bit in the position C is dropped or deleted and the remaining information bits in the positions A and B are stored in the font memory 27 as information bits for the bit positions E and F, respectively in the steps 150 and 160. For instance, when information bits in the bit positions A to D are a bit sequence pattern of "0, 1, 0, 0", i.e. a "white, black, white, white" pattern, the information bits "0" and "1" in the bit positions A and B are stored in the bit positions E and F in the font memory.

On the other hand, if the information bits in the bit positions A to D are a "1, 0, 1, 1" bit pattern, the information bits in the bit positions A and B, i.e. "1 0," are stored in the positions E and F in the memory. This bit pattern is classified as a classification number I in FIG. 4 and there are eight of these in total in FIG. 4. The purpose of this process is to drop the information bit in the bit position C as the line segment of a character is formed between the bit position C in one section and the bit position D of the next section or a relatively wide spaced portion is formed therebetween, and the form of a character can not be deformed, even if the information bit in the bit position C is preferentially dropped.

On the other hand, in the case where the bit information in the bit positions A and B are the same when compared, the bit in the bit position A is dropped and the bit information in the bit positions B and C are stored in the bit positions E and F of the font memory respectively, in the steps 170 and 180. The pattern belonging to this classification is a bit combination of "0 0 1 0" in the bit positions A to D and the bit "0, 1" are stored in the bit positions E and F. There are four occurrences of this kind in the table, which are classified as the classification number II. This is done because since the line of a character or a relatively wide spaced portion is formed in the bit information in the bit positions A and B, the bit information in the A bit position is dropped.

In the case where the bit information in the bit positions B and C are the same, the bit information in the bit position B is dropped for the same reason as described above and the bit information in the bit positions A and C are stored in the font memory in the steps 10 and 200. There are two occurrences of this bit pattern, which are classified as the classification number III.

The forth bit pattern having an alternative combination of binary digits "0" and "1", such as the bit combination of "0 1 0 1" and "1 0 1 0" which belongs to the classification number IV is processed in such a manner that the spaced portion, i.e. the bit "0", is preferentially dropped and the remaining bits "1,1" are stored or extracted in the steps 210 and 240. This is done because the form of the character is more deformed in dropping the bit "1" which is part of a line segment of the character than in dropping the spaced portion, i.e. the bit "0".

In the manner described above the process of extraction or dropping is carried out first in section $n_1$ and when this operation is terminated a similar extraction process is carried out on the second section $n_2$ to the eighth section $n_8$, where the compression processing is carried out by the use of the dummy dot bits and the compression processing for the first row terminates.

Likewise, the repeated compression operation or processing is carried out until the last (24th) row of the 24×24 dot matrix comes, where the dummy dots of the row are used in the manner as described above (see, the steps 270 and 280 in FIG. 5). After this processing, the compression in the lateral direction of the 24×24 dot matrix terminates and the 24×16 dot matrix is extracted and is stored in the font memory 27.

When similar operations have been carried out for the row sections $1_1$ to $1_8$ in the vertical direction of the 24×16 dot matrix in the step 290, the 16×16 dot matrix is extracted and is stored in the font memory 27.

FIGS. 2(A), 2(B), 3(A) and 3(B) show some examples of the font compression according to the embodiment of the font compression method of the present invention. Namely, FIGS. 2(A) and 3(A) show each 24×24 dot matrix before compression, and FIGS. 3(A) and 3(B) show each 16×16 dot matrix after compression.

It is to be appreciated from FIGS. 3(A) and 3(B) particularly that a preferable compression of the original font can be realized even if the font of characters is very complicated as in the Chinese characters. The font of complicated characters can be better compressed than simple ones, without cutting necessary lines such as vertical and horizontal lines and without losing the necessary spaced portions, but maintaining a good legibility of the characters, as well as maintaining a continuity of the inclined strokes or lines of the characters.

It is also to be understood that the present invention is not necessarily limited to the compression rate of 3 to 2 as shown in FIG. 2(B) and FIG. 3(B), but other compression rates such as 32×32 dot matrix into 22×22 dot matrix, as well as 22×24 dot matrix into 15×16 dot matrix are also possible.

Further, it is also possible according to the present invention to obtain a preferable compressed font extending in the vertical direction or horizontal direction by compressing a font only in columns or rows for an arbitrary XY dot matrix.

Moreover, it is to be appreciated that the present invention is not limited to software processing but it is easily realized by a hardware construction by the provision of reading means for reading bit information in each of the divided sections using logical operational elements.

As described in the foregoing, the font compression method according to the present invention comprises the steps of dividing the column and/or row of a first type font into a plurality of equal information bits in bit positions included in each section in accordance with a predetermined rule, extracting the remaining information bits in the specified bit positions, and repeating the above operations over the entire column and/or row, thereby forming a second type font from the information bits thus extracted through a well-balanced compression of characters and figures.

Accordingly, in the font compression method according to the present invention, only information bits corresponding to important line segments of characters and figures are extracted while dropping information bits concerning useless spaced portions or less important lines of the characters preferentially, thus forming the font of the second type without deforming the features, nature and form of the font of the first type. Accordingly, good legibility becomes possible for the characters and figures after compression, because of less deformation of the characters and figures.

It is also possible for the first type font stored in a font memory for a keyboard to be automatically compressed into the second type font, by use of the font compression apparatus including a CPU, a ROM, a RAM, and by having stored in the ROM preliminarily a control program corresponding to the font compression method, according to the present invention, with the characteristics or features, and forms of the original characters and figures being maintained.

Moreover, in the font compression apparatus suitable for realizing the font compression method according to the present invention, such as the embodiment described in the foregoing, the provision of a read-out head for reading the information bits in the bit positions A, B, C, in each section and the information bit in the bit position d (=A) in each of the next sections at time and logic circuit means enables information bits in each section to be read successively and also enables the information bits thus read to be processed through a hardware means such as the logic circuit means, thus making the processing time short with a relatively inexpensive apparatus.

In addition, when it is desired to reduce the processing time much more, a simultaneous read-out of the entire first type font through another read-out head enables the font of the first type to be instantaneously compressed into the font in the second type font, according to the font compression apparatus of the present invention.

While the invention has been described in its preferred embodiments, it is to be understood that various changes and modifications may be made within the purview of the appended claims without departing from the true scope and spirit of the invention in its broader aspects.

What is claimed is:

1. A font compression method for compressing a first type font of characters and figures arranged in an XY dot matrix into a second type font of the same characters, arranged in a second NM dot matrix by dropping predetermined dots in the column and row directions of the XY dot matrix, comprising the steps of:
   (a) dividing said XY dot matrix into a plurality of sections comprising a predetermined number of bit positions along the columns and rows of said first type font;
   (b) adding at least one dummy dot column and /or one dummy dot row to the final column and the final row of said XY matrix, so as to carry out a bit comparison of the final bit in the final section with the dummy dot of the XY matrix;
   (c) comparing bit by bit information bits existing in the different specific bit positions in each one section and a first bit position of each of the adjacent next section with each other;
   (d) dropping at least one information bit in a specified bit position in each section respectively in accordance with the result of each comparison and extracting a pair of specific information bits in specific positions in each section as compressed information bits from possible combinations of information bits; and
   (e) repeating the operation of the steps (c) and (d) starting from the first section to the last section plus one dummy dot and then to the next row, until the last section of row plus one dummy dot has been reached, so as to extract each pair of compressed information bits, thereby obtaining the compressed font of the second type having a good compression quality arranged in the NM matrix from information bits thus extracted.

2. The method as set forth in claim 1 wherein the number of said divided sections in the column and row directions is eight sections in the column and row directions and each section consists of three bit positions (A,B,C).

3. The method as set forth in claim 1, wherein said bit comparison is carried out per two bits each, for said each section as follows:
   (f) the third bit position (C) and the first bit position (D=A) of the adjacent next section;
   (g) the first bit position (A) and the second bit position (B); and
   (h) the second bit position (B) and the third bit position (C) being compared with respect to the information bits contained in each bit position.

4. The method as set forth in claim 3 wherein when the comparison is established in the case of (f) above, the information bit in the third bit position is dropped and the information bits in the first and second bit positions (A,B) are extracted and when the comparison is established, in the case of (g) the information bit in the first bit position (A) is dropped and the information bits in the second and third bit positions (B,C) are extracted, as well as when the comparison is established in the case of (h) the information bit in the second bit position (B) is dropped similarly and the information bits in the first and third bit positions (A,C) are extracted.

5. The compression method as set forth in claim 1 wherein when the information bits existing in the first, second, and third bit positions (A, B, C) and the first bit position (D) in the adjacent next section appear such as a bit pattern of "1, 0, 1, 0," or "0, 1, 0, 1", the information bit "0" in the third bit position (C) in the former or the second bit position (B) in the latter is dropped.

6. The compression method as set forth in claim 2 wherein when the information bits existing in the first, second, third bit positions (A, B, C) and the first bit position (D) in the adjacent next section appear such as a bit pattern of "1, 0, 1, 0," or "0, 1, 0, 1", the information bit "0" in the third bit position (C) in the former or the second bit position (B) in the latter is dropped.

7. The compression method as set forth in claim 1 wherein said XY matrix is arranged in a 24×24 dot matrix and said NM dot matrix is arranged in a 16×16 dot matrix.

8. The compression method as set forth in claim 2 wherein said XY matrix is arranged in a 24×24 dot matrix and said NM dot matrix is arranged in a 16×16 dot matrix.

9. The compression method as set forth in claim 1 wherein said XY matrix is a dot matrix such as 32×32, 32×24, or 22×24 dots, and said second NM matrix is a dot matrix such as 22×22, 22×16, or 15×16 dots.

10. A font compression apparatus for compressing a first type font of characters and figures arranged in an XY matrix into a second type font of the same characters and figures, arranged in a second matrix by dropping predetermined dots in at least one of the column and row directions of the XY dot matrix, comprising:
   (a) a keyboard;
   (b) a front memory for storing said first type font inputted from said keyboard;
   (c) a central processing unit (CPU) for receiving and processing information associated with the first type font sorted in said font memory; and
   (d) a control memory, coupled to said CPU, for storing predetermined control instructions for said CPU, whereby the first type font which has been inputted from the keyboard and stored in said font memory is processed by said CPU in response to the control instructions stored in said control memory and is automatically converted into the second type font which is required by a peripheral device, wherein said CPU includes means for dividing said XY dot matrix into a plurality of sections comprising a predetermined number of bit positions along said at least one of said column and row directions; means for comparing information bits existing in at least two bit positions of one of said sections and a first bit position in an adjacent next section; and means for dropping at least one information bit in a specified bit position in said one section in accordance with the result of the comparison and extracting the remaining information bits in said one section as compressed information bits.

11. A method of compressing each character of a font represented by series of dots in a matrix, comprising the steps of:
(a) partitioning said series of dots into a plurality of lateral bit groups equal to the number of bits to be deleted with respect to the row direction;
(b) adding one dummy column to the last column of said matrix;
(c) examining each lateral bit group to determine which dot should be deleted from the constituent bits of the lateral group by finding one pair of adjacent bits of like value;
(d) deleting dots from each row in accordance with the results of said examining step;
(e) dividing said series of dots into a plurality of vertical bit groups equal to the number of bits to be deleted with respect to the column direction;
(f) joining one dummy row subsequent to the last row of said matrix;
(g) examining each of the vertical bit group for determining what dot should be deleted from the constituent bits of the vertical group by finding one pair of adjacent value bits of like value;
(h) deleting dots from each column in accordance with the results of said examining step;
wherein the determination as to whether a dot is to be deleted from each group takes into account the immediately adjacent bit that belongs to said dummy row or column, or a group adjacent to said subjected to the determination, amd whether said end bit has the same value as said adjacent bit.

* * * * *